(12) United States Patent
Glenn et al.

(10) Patent No.: US 6,448,506 B1
(45) Date of Patent: Sep. 10, 2002

(54) SEMICONDUCTOR PACKAGE AND CIRCUIT BOARD FOR MAKING THE PACKAGE

(75) Inventors: Thomas P. Glenn, Gilbert; Steven Webster; Roy D. Holloway, both of Chandler, all of AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/752,662

(22) Filed: Dec. 28, 2000

(51) Int. Cl.⁷ .................................................. H05K 1/16
(52) U.S. Cl. ........................ 174/260; 174/261; 257/686; 257/698
(58) Field of Search ................................ 174/260, 261, 174/255; 257/698, 686, 738, 779, 786, 737; 438/175; 361/760

(56) References Cited

U.S. PATENT DOCUMENTS

| | | | | |
|---|---|---|---|---|
| 4,398,235 A | | 8/1983 | Lutz et al. ................... 361/393 |
| 4,570,337 A | * | 2/1986 | Butt ............................ 174/261 |
| 4,996,587 A | | 2/1991 | Hinrichsmeyer et al. ...... 357/74 |
| 5,394,010 A | | 2/1995 | Tazawa et al. ............... 257/686 |
| 5,397,921 A | * | 3/1995 | Karnezos ..................... 257/698 |
| 5,478,007 A | * | 12/1995 | Marrs ........................... 438/125 |
| 5,594,275 A | | 1/1997 | Kwon et al. ................. 257/686 |
| 5,625,221 A | | 4/1997 | Kim et al. ................... 257/686 |
| 5,668,405 A | | 9/1997 | Yamashita ................... 257/668 |
| 5,744,827 A | | 4/1998 | Jeong et al. ................. 257/686 |
| 5,760,471 A | | 6/1998 | Fujisawa et al. ............. 257/692 |
| 5,801,439 A | | 9/1998 | Fujisawa et al. ............. 257/686 |
| 5,835,355 A | | 11/1998 | Dordi .......................... 361/760 |
| 5,835,988 A | | 11/1998 | Ishii ............................. 257/684 |
| 5,838,060 A | * | 11/1998 | Comer ......................... 257/686 |
| 5,883,426 A | | 3/1999 | Tokuno et al. ............... 257/686 |
| 5,986,209 A | | 11/1999 | Tandy .......................... 174/52.4 |
| 6,072,233 A | | 6/2000 | Corisis et al. ............... 257/686 |

FOREIGN PATENT DOCUMENTS

JP  63249345  10/1988  ........... H01L/21/60

\* cited by examiner

*Primary Examiner*—Albert W. Paladini
(74) *Attorney, Agent, or Firm*—Skjerven Morrill LLP; James E. Parsons

(57) ABSTRACT

Disclosed herein are semiconductor packages and stacks thereof. An example package includes an insulative substrate having a first surface, first apertures, a second aperture, and circuit traces on the first surface. A first portion of each circuit trace overlies a first aperture and an end of the circuit trace is near the second aperture. A solder ball is in each first aperture, fused to the overlying circuit trace. A semiconductor die is in the second aperture and is electrically connected to the ends of the traces. A third aperture may extend through the first portion of each circuit trace. A second package can be stacked on a first package. Solder balls of the second package each fuse with an underlying solder ball of the first package through a third aperture of the first package. The dies of the stacked packages may be positioned for optical communication with each other.

27 Claims, 8 Drawing Sheets

US 6,448,506 B1

SEMICONDUCTOR PACKAGE AND CIRCUIT BOARD FOR MAKING THE PACKAGE

CROSS REFERENCE TO RELATED APPLICATION

This application is related to another U.S. patent application, Ser. No. 09/752,244, which is entitled "Method of Making and Stacking a Semiconductor Package," was filed on the same day as the present application, and is incorporated herein by reference in its entirety.

BACKGROUND OF THE INVENTION

1. Field of the Invention

The present invention relates generally to electrical circuits and devices. More particularly, the present invention relates to semiconductor packages, and circuit boards and methods for making semiconductor packages.

2. Related Art

Certain types of conventional semiconductor packages, such as ball grid array (BGA) packages, include an internal substrate. The substrate includes a core insulative sheet. Metal traces and a metal die pad are provided on a top surface of the substrate. Metal traces also are provided on an opposite bottom surface of the substrate. Metal-lined vias through the substrate electrically connect the metal traces on the top and bottom surfaces of the substrate. A semiconductor die is attached to the die pad on the top surface of the substrate. Bond wires electrically connect bond pads of the die to metal traces on the top surface of the substrate. A hardened encapsulant covers the die and bond wires, and the entire top surface of the substrate. Solder balls are fused to the metal traces on the bottom surface of the substrate. The solder balls, therefore, are electrically connected to the die through the metal traces, vias, and bond wires.

One drawback of this conventional package is that physical forces applied to the package may cause the solder balls to shear off the metal traces of the substrate. In addition, the packages cannot be stacked one on top of another due to the encapsulant. It also is difficult to test the package once the package is soldered to a motherboard, since the reflowed solder balls are not easily accessible from the periphery of the package, and the top of the package is covered with encapsulant.

Another drawback lies in the complexity of the process of making the substrate of the package. As mentioned above, metal traces are present on both the top and bottom surfaces of the substrate. To form these traces, metal substrates are laminated to the top and bottom surfaces of the core insulative sheet. Next, holes are drilled through the insulative sheet and the metal layers. Subsequently, the holes are plated with metal to form the vias, and both of the metal substrates are patterned by photolithography and etching to form the metal traces. Each of these steps costs time and money, and thus a simplification of the process would be advantageous.

SUMMARY OF THE INVENTION

In accordance with embodiments of the present invention, improved semiconductor packages and methods and circuit boards for making the semiconductor packages are provided.

In accordance with an embodiment of the present invention, a method of making an internal printed circuit board for a semiconductor package includes: providing an insulative sheet having a first surface and an opposite second surface; forming a plurality of first apertures and a second aperture through the sheet between the first surface and the second surface, wherein each first aperture is adapted to receive a solder ball and the second aperture is adapted to receive a semiconductor die; and subsequently forming a layer of conductive circuit traces on the first surface of the sheet. First portions of the conductive circuit traces overlie the first apertures, and ends of the circuit traces are proximate to the second aperture. The circuit traces may horizontally overhang the second aperture, or may be located outside the perimeter of the second aperture. No circuit traces are provided on the bottom surface of the printed circuit board. In an optional step, third apertures may also be formed through the first portions of the circuit traces, i.e., through the portions of the circuit traces overlying the first apertures.

In accordance with another embodiment of the present invention, a printed circuit board for making a semiconductor package includes: an insulative sheet having a first surface, an opposite second surface, a plurality of first apertures through the sheet, and a second aperture through the sheet, wherein the first apertures are each adapted to receive a solder ball and the second aperture is adapted to receive a semiconductor die; and a layer of conductive circuit traces on the first surface of the sheet, wherein respective first portions of the conductive circuit traces overlie respective first apertures, and ends of the conductive circuit traces extend over the second aperture. No circuit traces are provided on the bottom surface of the sheet in this embodiment.

In accordance with another embodiment of the present invention, a method of fabricating a semiconductor package includes: providing a printed circuit board as described above; placing a semiconductor die in the second aperture on the overhanging ends of the circuit traces; forming an electrical connection between the bond pads of semiconductor die and the overhanging ends of the circuit traces; placing a solder ball in each of the respective first apertures; and fusing the solder ball to the first portion of the circuit trace overlying the respective first aperture, thereby electrically connecting each solder ball to the die through a circuit trace. Optionally, the second aperture, the die, and an inner subportion of the printed circuit board around the second aperture are encapsulated.

In accordance with another embodiment of the present invention, a semiconductor package includes: a printed circuit board as described above; a plurality of solder balls, wherein each solder ball is in one of the respective first apertures and is fused to the overlying first portion of one of the circuit traces; and a semiconductor die in the second aperture. The die is mounted on the overhanging ends of the circuit traces and is electrically connected thereto. Optionally, the second aperture and the die may be encapsulated. The first apertures and the solder balls are outside a perimeter of the encapsulant.

The package design of the present invention prevents shearing of solder balls from the package by inserting the solder balls through an aperture in the substrate, thereby physically shielding the solder ball.

In other circuit board and package embodiments, third apertures are provided through the first portion of each of the circuit trace, i.e., through the portion of the respective circuit trace that overlies one of the first apertures. A portion of the solder of the solder ball subsequently provided in the first aperture fills the third aperture, so as to be exposed at the upper first surface of the circuit board. After the package is mounted on a motherboard, the exposed solder may be touched from above the circuit board of the package with a test probe in order to electrically test the electrical connection between the motherboard and the respective reflowed solder balls of the package. Of course, there is no encapsulant over the top surface of the circuit board opposite the solder balls in this embodiment, else the test probe could not make contact with the exposed portions of the solder balls.

Packages with such third apertures can easily be stacked in accordance with another embodiment of the present invention. An exemplary stack of semiconductor packages includes: at least first and second semiconductor packages, as described above, wherein the second package is mounted on top of the first package so that each solder ball of the second package is fused to a solder ball of the second package through a third aperture.

In a further embodiment, where the semiconductor die of each of the stacked packages is an optical device, the packages may be stacked so that the dies may be in optical communication with each other. In such an embodiment, a first semiconductor package is mounted on a motherboard so that the optical circuitry of the die faces away from the motherboard. A second semiconductor package is stacked on the first package so that the optical circuitry of the die of the second package faces the optical circuitry of the die of the first package and the motherboard. One or both of the packages may have an optically clear structure, such as a lid, lens, or optically clear encapsulant, that is provided over the optical circuitry of the die so as to transmit light to the optical circuitry.

These and other aspects of the present invention may be better understood by a consideration of the following detailed description and the appended drawings.

BRIEF DESCRIPTION OF THE DRAWINGS

FIG. 4b is a cross-sectional side view of a circuit board used to make the package of FIG. 4a.

DETAILED DESCRIPTION

FIGS. 1a–1g provide cross-sectional side views of stages in an exemplary process of making a semiconductor package in accordance with one embodiment of the present invention. The process includes a sub-process of making an internal circuit board for the package.

Figure 1A:
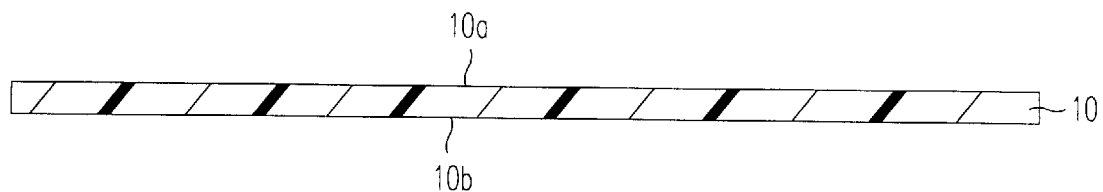
FIGS. 1a–1g show cross-sectional side views of stages during a process for making a semiconductor package.

The process begins by providing an insulative sheet 10, as depicted in FIG. 1a, that may be used for forming a printed circuit board. Sheet 10 has an upper first surface 10a and a lower second surface 10b. Sheet 10 may be made of BT, FR4, or FR5 materials. Other glass fiber filled organic (e.g., epoxy-based or Teflon®-based) laminates also may be used. A supplier and assembler of such boards is UMTC of Taiwan.

It is particularly advantageous to use glass fiber filled organic laminate substrates for insulative sheet 10 because they are commonly available, and are less expensive, easier to handle, and more rigid than film or tape substrates. Such substrates also may be drilled easily and quickly with a conventional metal drill to form apertures through the substrate, as is discussed further below.

Typically, surfaces 10a, 10b of sheet 10 will be large enough in area to accommodate the formation of a matrix of package sites. An individual semiconductor package is assembled at each package site. After the semiconductor packages are fully assembled, the large sheet is cut with a saw or snapped between the package sites so as to singulate a plurality of individual packages each including a printed circuit board made from sheet 10.

Figure 1B:
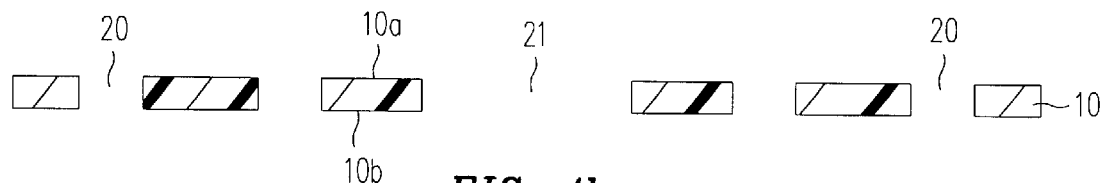

A plurality of round holes 20 are formed through sheet 10, as depicted in FIG. 1b. Each hole 20 ultimately receives a solder ball, and is sized accordingly. (See FIG. 1g.) Holes 20 are arranged so that the solder balls to be inserted therein have a desired arrangement (e.g., rows and columns). In addition, a larger rectangular hole 21 is formed through a central area of sheet 10. Typically, holes 20 fully surround hole 21 (see, e.g., FIG. 2). Holes 20, 21 may be formed, for example, by drilling with a metal drilling tool.

Typically, holes 20, 21 would be formed by stacking a plurality of identical epoxy-based or other organic glass fiber filled laminate sheets 10 (e.g., four or eight sheets 10) in a fixture in precise vertical alignment, and then drilling through the stack of sheets 10 using a metal drilling tool so as to simultaneously form a plurality of drilled sheets 10 each with identically-sized holes 20, 21 formed precisely in the same locations.

Figure 1C:
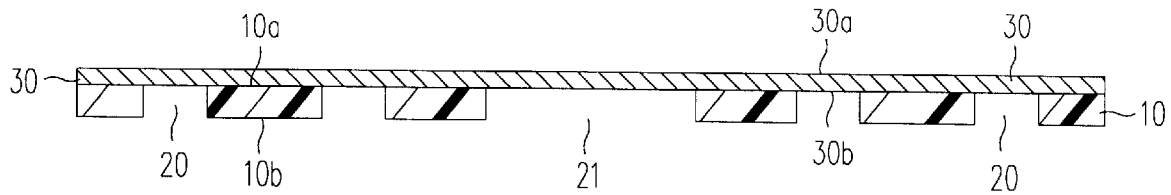

Turning now to FIG. 1c, a metal foil 30 is attached to first surface 10a of sheet 10 after holes 20, 21 are formed through sheet 10. Metal foil 30 may be a half-ounce copper foil and may be attached to first surface 10a of sheet 10 with an adhesive. Metal foil 30 overlies holes 20, 21. Alternatively, metal foil 30 may be comprised of a plurality of metal layers, e.g., copper plated with nickel. Metal foil 30 has an exposed upper first surface 30a, and a lower second surface 30b that is attached to first surface 10a of sheet 10 with an adhesive. Typically, a lamination process would be used that attaches metal foil to an adhesive layer on first surface 10a of sheet 10 using pressure and heat.

Figure 1D:
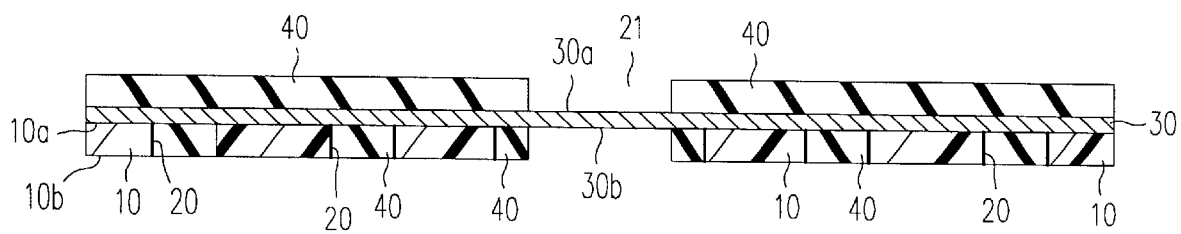
Figure 1E:
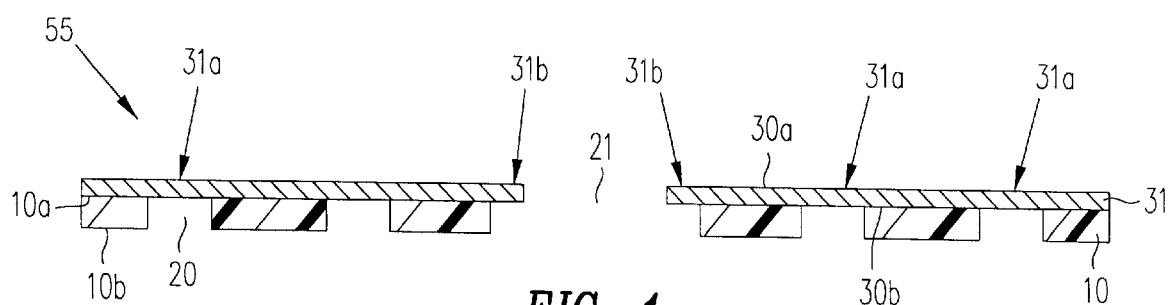

After the attachment of metal foil 30 to first surface 10a, metal foil 30 is patterned to form a layer discrete metal circuit traces 31 on first surface 10a of sheet 10 (see FIG. 1e). In an exemplary process, a layer of photoresist 40 is applied onto the first surface 30a of metal foil 30, as depicted in FIG. 1d. Photoresist 40 also is applied within holes 20, 21 so that the exposed bottom surface 30b of metal foil 30 within holes 20, 21 is covered. Subsequently, the photoresist 40 on top surface 30a of foil 30 is formed into a patterned mask by photolithography. The mask so formed includes an aperture through which the central portion of metal foil 30 over hole 21 is exposed. Finger-like portions of metal foil 30 above the perimeter of hole 21 remain covered with correspondingly-shaped fingers of photoresist 40. Foil 30 is then etched through the mask so as to form a layer of discrete metal circuit traces 31. Plasma or liquid chemical etching techniques may be used. After etching, photoresist 40 is removed.

Figure 2:
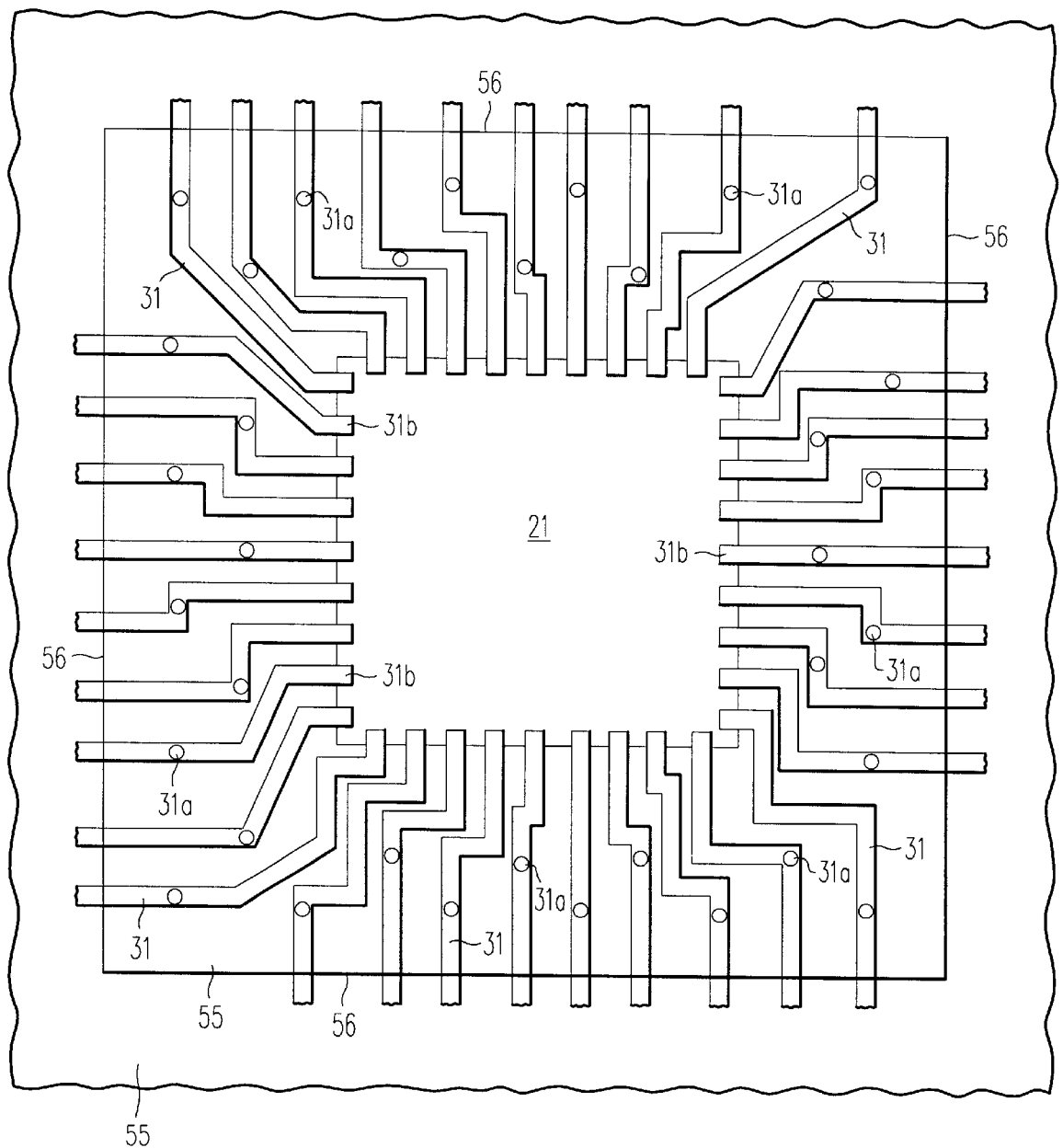
FIG. 2 is a top plan view of the circuit board shown in FIG. 1e.

FIGS. 1e and 2 show a printed circuit board 55 formed by the above described process. Printed circuit board 55 is planar and includes a core insulative sheet 10 of a glass fiber filled organic laminate. Printed circuit board 55 has a planar upper first surface 10a and an opposite planar lower second surface 10b. Holes 20,21 extend through sheet 10. A plurality of discrete circuit traces 31 (FIG. 2) is on upper first surface 10a of sheet 10. Each circuit trace 31 has a first portion 31a that overlies one of the holes 20. The underside of each first portion 31a, i.e., lower second surface 30b of the respective circuit trace 31, is exposed through the respective hole 20. Finally, short horizontal finger-like ends 31b of those individual metal traces 31 horizontally overhang the peripheral edges of hole 21. Unlike the conventional insulative substrate described in the background section above, no metal traces are present or necessary on lower second surface 10b of sheet 10 and no via holes are necessary or present through the substrate Obviously, this obviates the need for one of the metal layers, the associated patterning step and the via-hole forming step needed to make a conventional BGA package like that described above. Optionally, a layer of insulative solder mask material may be applied onto upper first surface 10a of sheet 10 of printed circuit board 55 so as to insulate all or part of upper first surface 30a of the metal traces 31.

FIG. 2 is a top plan view of printed circuit board 55. As mentioned above, a matrix of interconnected package sites, e.g., interconnected circuit boards 55, typically would be formed in parallel using a large sheet 10 (i.e., a sheet large enough for a plurality of package sites to be formed thereon). Border 56 is drawn to show the borders of adjacent circuit boards 55.

To make such a matrix, sets of holes 20 are formed at each package site. A hole 21 would be formed for each set of holes 20. A single large metal foil 30 is subsequently attached (e.g., with an adhesive and by a heat and pressure lamination process) to a surface of the large sheet 10 so as to cover the previously formed holes 20, 21 of each of the package sites. The metal foil 30 can then be patterned so that the circuit traces 31 of all of the packages sites are integrally connected, as shown in FIG. 2. (Please note that each trace 31 overlies a hole 20; holes 20 are shown in FIG. 2 as circles within a trace 31.) Alternatively, traces 31 may be made more narrow than the width of holes 21, in which case round lands may be formed in traces 31 over holes 21.

Having the traces 31 of each package site of the matrix integrally connected, as shown in FIG. 2, facilitates electrical grounding during the assembly process, thereby helping to avoid damage due to electrostatic discharge. In addition, the circuit traces 31 of all of the package sites may be plated in a single step using conventional plating processes. For example, where metal traces 31 are formed of copper, then layers of gold, silver, nickel, or palladium, or combinations thereof may be plated onto portions of the upper and lower surfaces 30a, 30b of traces 31 (e.g., portions 31a and ends 31b may be plated).

Optional, the inner walls of sheet 1 around holes 20 may be plated with a metal layer, e.g., nickel, gold, or palladium, to provide an additional connection between circuit board 55 and the solder balls subsequently installed in holes 20 (see FIG. 1f). Printed circuit board 55 also may be provided with a layer of an insulative solder mask over upper first surface 10a of sheet 10, so that upper first surface 30a of traces 31 are covered by the solder mask, at least in part.

Figure 1F:
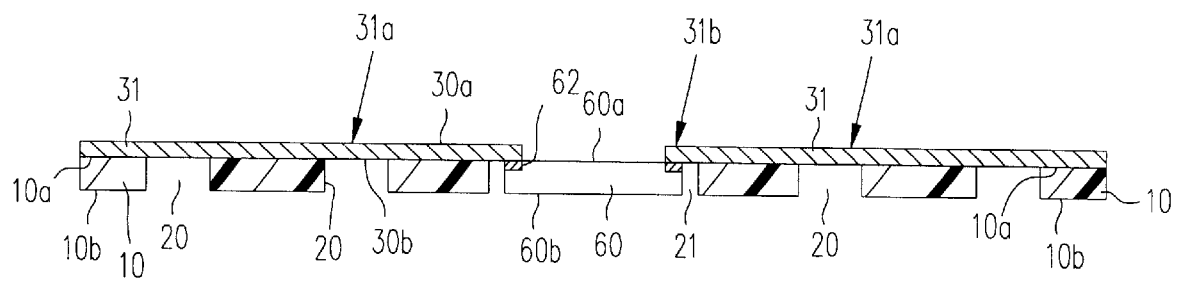

Referring now to FIG. 1f, a semiconductor die 60 is provided. Die 60 may be a memory device, such as a DRAM, SRAM, or flash memory device, or any other type of integrated circuit device (e.g., processor or logic device). Die 60 has an active first surface 60a, and an opposite in-active second surface 60b. Where die 60 is an optical device, i.e., a device that transmits and/or receives light, then a light sensing circuit or light emitting circuit may be present on active surface 60a.

In the example shown, die 60 includes a plurality of metal edge bond pads 62 that serve as input/output pads for die 60. In particular, bond pads 62 are arrayed in single line rows adjacent to each of the four peripheral edges of first surface 60a of die 60.

Die 60 of FIG. 1f is placed within hole 21. Active surface 60a of die 60 is oriented in the same direction as upper first surface 10a of sheet 10, and inactive surface 60b is oriented in the direction of lower surface 13 of substrate. Solder is used to electrically connect each bond pad 62 of die 60 to lower second surface 30b of one of the overhanging ends 31b of circuit traces 31 of printed circuit board 55. Advantageously, die 60 is fully within the thickness of printed circuit board 55. That is active upper surface 60a is in the horizontal plane of or below upper surface 10a of sheet 10, and inactive lower surface 60b of die 60 is above or in the same horizontal plane as lower surface 10b of sheet 10. This allows for a thinner package than the conventional BGA. Further, this allows solder balls 68 (see FIG. 1g) to be smaller, which yields a further reduction in package thickness. Die 60 may be thinned by polishing inactive lower surface 60b.

Figure 1G:
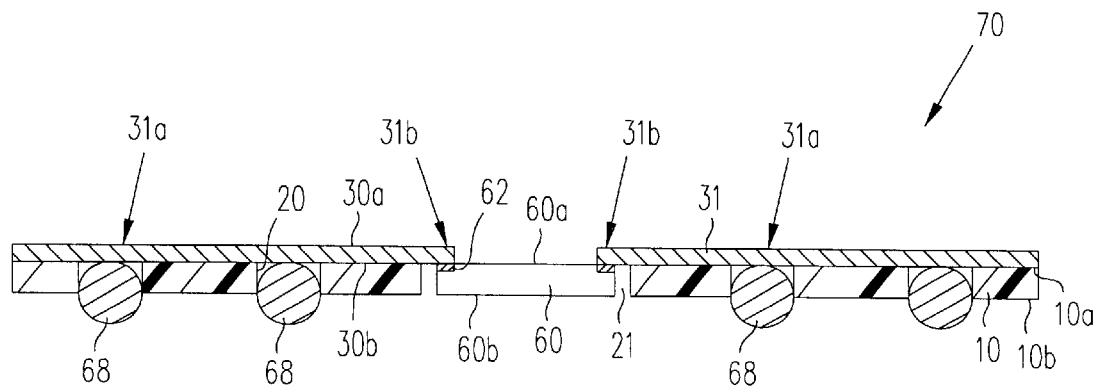

Referring to FIG. 1g, a plurality of solder balls 68 are provided. Each solder ball 68 is inserted into a hole 20, and is fused-to lower second surface 30b of portion 31a of the overlying metal trace 31. Accordingly, each solder ball 68 is electrically connected to die 60 through traces 31 on upper first surface 10a of sheet 10 of printed circuit board 55.

Solder balls 68 extend vertically through printed circuit board 55 from their point of connection to the underside 30b of a trace 31 to a free end below second surface 10b of sheet 10. In particular, each solder ball 68 is round, and has a diameter greater than a thickness of circuit board 55 between upper first surface 10a and lower surface 10b of sheet 10 but slightly less than the diameter of holes 21. For example, sheet 10 may be 0.1–0.5 mm thick, and round solder balls 68 may have a diameter of 0.2–0.7 mm. About 30–70% of the diameter of solder ball 68 is exposed below lower second surface 10a of sheet 10. In alternative embodiment, round solder ball 68 is replaced by a cylindrical column of solder.

As a typical example of an thin package, 50% or more of the height of the solder ball, e.g., 55% to 70%, is within hole 21 and is shielded by the surrounding inner walls of hole 21.

In an alternative embodiment, where holes 20 are lined with metal, as described above, each solder ball 66 also may be fused to the metal lining of the respective hole 20, thereby forming an extra secure connection to printed circuit board 55.

Assuming, as mentioned above, that a plurality of packages are formed at interconnected package sites on a large sheet 10, a saw or laser is used to cut along border 56 (FIG. 2), through sheet 10 and the metal traces 31, thereby forming a plurality of individual packages 70, as shown in FIG. 1g. Each package 70 includes a die 60 that is electrically connected to the solder balls 68 on a printed circuit board 55 through traces 31. In addition, the severed ends of traces 31 are in the plane of an orthogonal severed peripheral edge of printed circuit board 55.

Figure 1H:
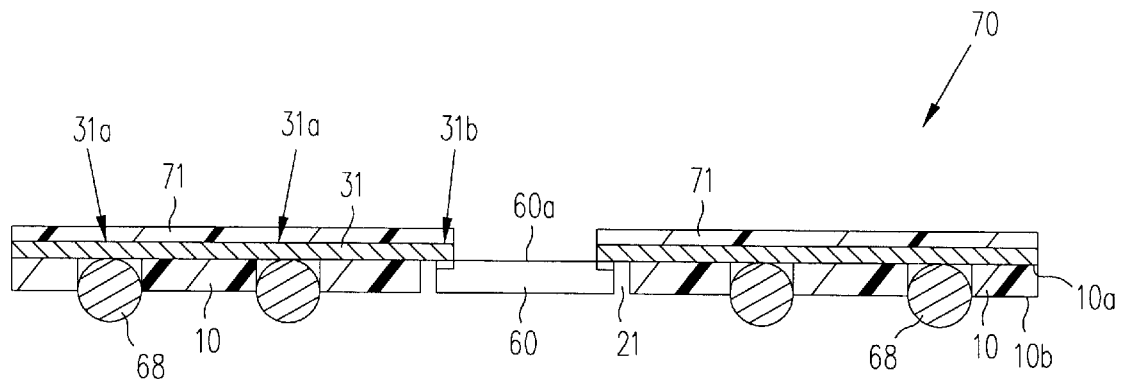
FIG. 1h is a cross-sectional side view of the package of FIG. 1g with an optional layer of solder mask on the top surface of the circuit board of the package.

FIG. 1h shows package 70 of FIG. 1g with an optional layer of insulative solder mask 71 applied over upper first surface 30a of traces 31 on upper first surface 10a of sheet 10 of circuit board 55. Solder mask 71 may be an epoxy-based resin.

Figure 3A:
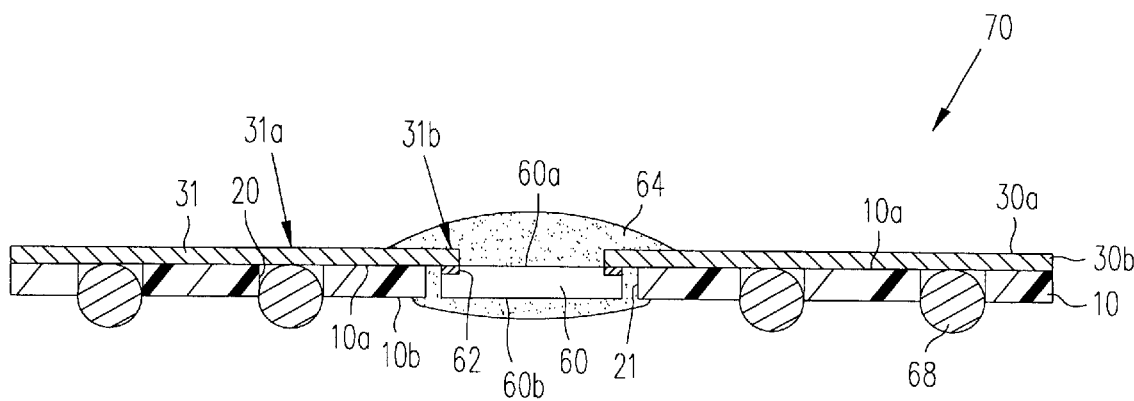
FIGS. 3a–3c are cross-sectional side views of alternative semiconductor packages.

According to an alternative assembly process within the present invention, package 70 may be provided with an encapsulant or other covering over die 60. For example, in FIG. 3a, an insulative encapsulant 64 is applied within hole 21 and over both active surface 60a and inactive surface 60b of die 60. Encapsulant 64 also covers ends 31b of traces 30 and interior sub-portions of first surface 10a and second surface 10b of sheet 10 of printed circuit board 55. As shown, encapsulant 64 of this embodiment does not cover the entire upper first surface 10a of sheet 10. The region of sheet 10 that includes holes 21 and solder balls 68 is beyond a perimeter of, and thus uncovered by, encapsulant 64. Encapsulant 64 may be applied by molding, liquid encapsulation, or glob top techniques, and may be hardened by a conventional heat or ultraviolet curing processes, depending on the material selected. Where die 60 is an optical device, such that light receiving or light emitting circuits are exposed at active surface 60a, then encapsulant 64 may be an optically clear material that transmits such light.

Figure 3B:
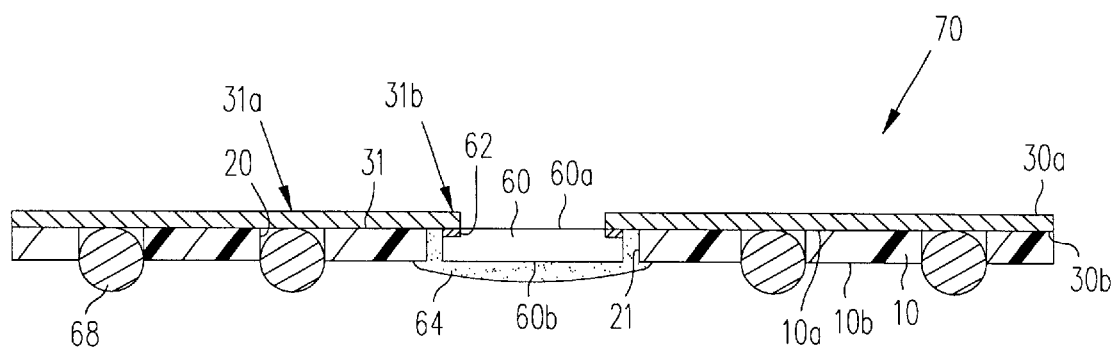

A further alternative embodiment of package 70 is shown in FIG. 3b. Here, encapsulant 64 is applied on inactive surface 60b of die 60, on lower second surface 10b of sheet 10 around hole 21, and in hole 21 around die 60 and below ends 31a of traces 31. The active surface 60a of die 60 and upper first surface 10a of substrate 12 are not covered by encapsulant 64. The encapsulant 64 may be applied using a glob top technique.

Figure 3C:
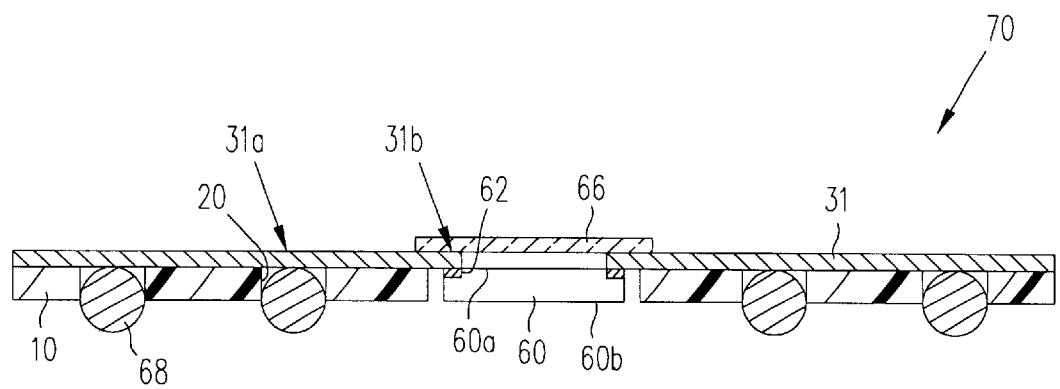

Another alternative embodiment is shown in FIG. 3c. A planar lid 66 is attached to upper first surface 10a of sheet 10 of printed circuit board 55, including over the ends 31b of traces 31, so that lid 66 is over hole 21 and die 60. Lid 66 may be formed of plastic, ceramic, or insulated metal, and may be attached using an adhesive.

Where die 66 is an optical device, lid 66 may be an optically clear material, such as glass, borosilicate glass, or clear plastic. Alternatively, instead of having a planar lid 66, lid 66 may be a clear concave or convex lens.

Figure 4A:
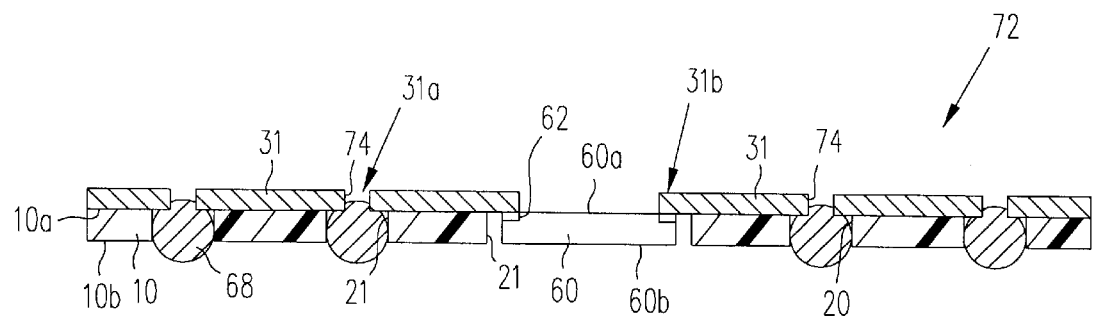
FIG. 4a is a cross-sectional side view of an alternative semiconductor package, wherein the solder balls of the package are exposed through the top surface of the circuit board.
Figure 4B:
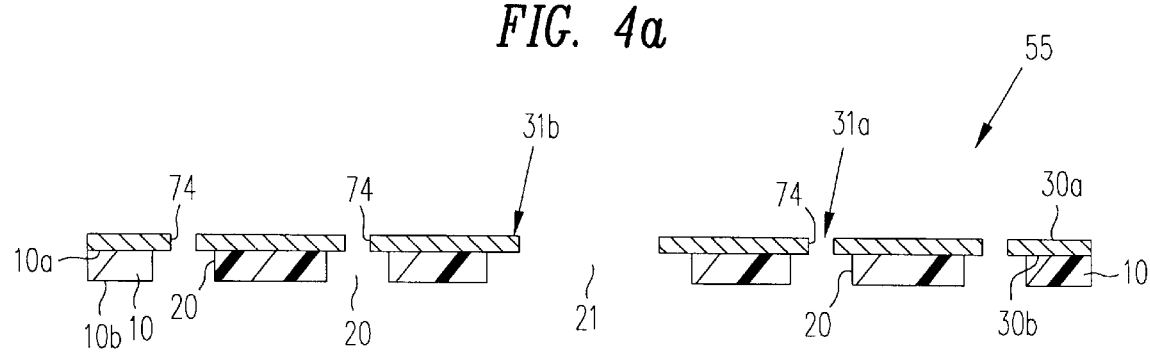
Figure 4C:
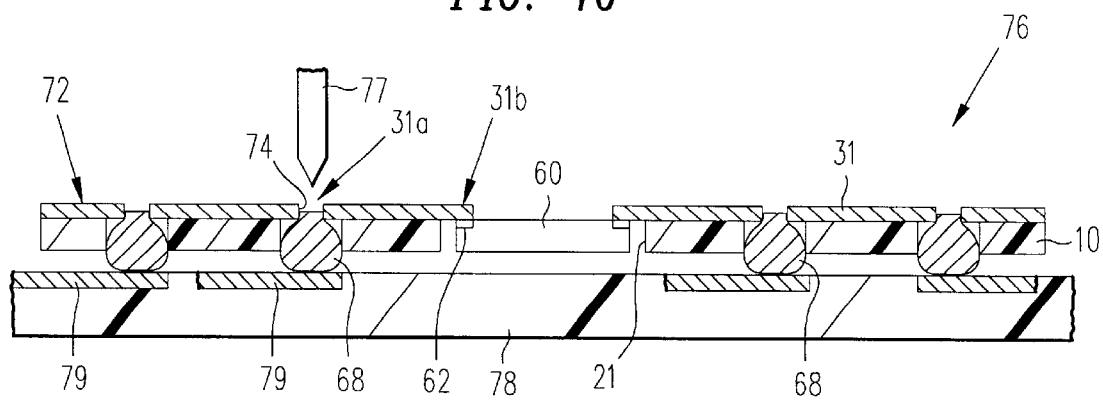
FIGS. 4c and 4d are cross-sectional side views of semiconductor package mountings, in each of which a semiconductor package is mounted on a motherboard and a test probe is positioned above the top surface of the circuit board of the respective package.

An alternative package 72 in accordance with the present invention is shown in FIG. 4a. Like package 70 of FIG. 1g, package 72 may be formed using the process of FIGS. 1a–1g. However, the steps shown in FIGS. 1d and 1e of patterning metal foil 30 are modified to provide an additional feature. Referring to FIG. 1d, during this alternative patterning step, apertures are formed through the photoresist lines that mask the portions of metal foil 30 that overlie holes 20, i.e., the mask apertures overlie first portions 31a of traces 31 of FIGS. 1d and 2. During the subsequent step of etching metal foil 30, a hole 74 (FIG. 4b) is formed through metal foil 30 over hole 20. Hole 74 is smaller in diameter than hole 20. Subsequently, when solder balls 68 are inserted into holes 20 and reflowed, as shown in FIG. 4c, solder from the solder ball 68 that is in hole 21 fills the overlying hole 74 and meets a small upper surface 30a of first portion 31a of trace 31 around hole 74. Therefore, a portion of the solder of each solder ball 68 is exposed at upper first surface 10 of sheet 10 of printed circuit board 55 through hole 74 in first portion 31a of the overlying metal trace 31. Accordingly, each solder ball 68 is accessible from above through printed circuit board 55.

FIG. 4c shows a mounting 76 comprised of a package 72 mounted on a motherboard 78. Since a portion of the solder of each solder ball 68 is exposed through the overlying hole 74, an electrical test probe 77 positioned above first surface 10a of sheet 10 of printed circuit board 55 can be touched to the exposed solder through hole 74. Accordingly, the electrical connection between package 72 and metal traces 79 of motherboard 78 of mounting 76 can easily be tested from above printed circuit board 55 of package 72.

Figure 4D:
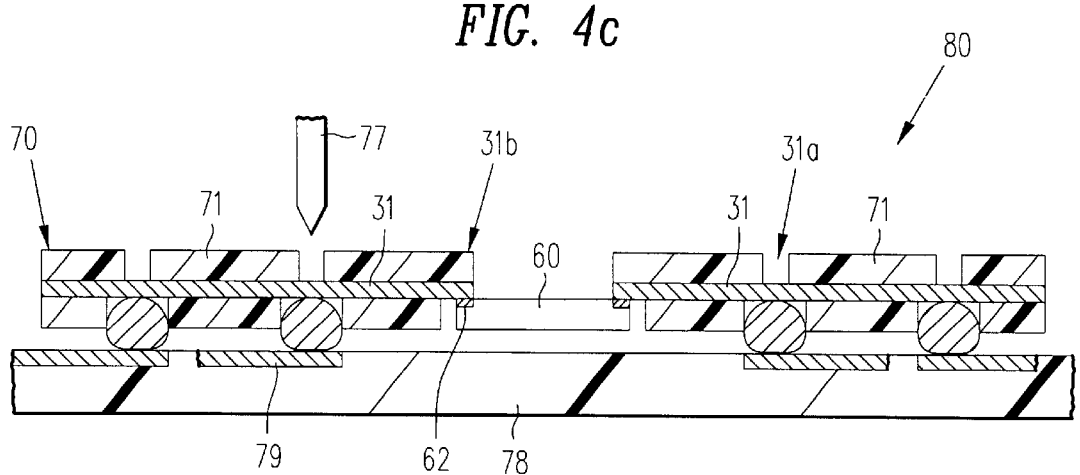

Referring to FIG. 4d, package 70 of a mounting 80 also may be tested using an electrical probe 77 positioned above printed circuit board 55, provided that there is no solder mask material 71 over upper first surface 30a of first portion 31a of traces 31. Since the solder balls 68 in holes 20 are fused to lower second surface 30b of portions 31a of traces 31, a test probe positioned above first surface 10a of sheet 10 may be touched to the exposed upper first surface 30a of portions 31a to test the electrical connection of solder balls 68 to the motherboard 78.

A further aspect of providing holes 74 through circuit traces 31 of package 72 of FIG. 4a is that a plurality of packages 72 may be stacked one on top of the other, and thereby may be electrically connected to each other. Such stacking is useful, for example, where die 60 is a memory device.

Figure 5:
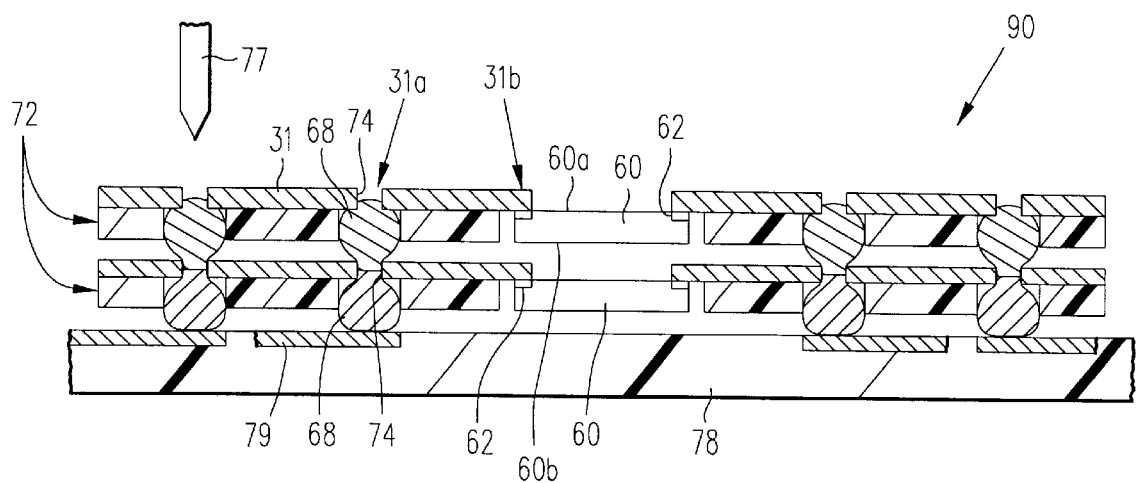
FIGS. 5, 6, 7 and 8 are cross-sectional side views of semiconductor package mountings, in each of which a stack of semiconductor packages is mounted on a motherboard.

An exemplary mounting 90 including a stack of two packages 72 mounted on a motherboard 78 is shown in FIG. 5. As shown, each solder ball 68 of the upper package 72 is fused to a solder ball 68 of the lower package 72 through a hole 74 of the lower package 72, thereby forming an electrical connection between the stacked packages 72 and the dies 60 therein. The interconnection of the packages 72 is very strong due to the melding of the solder balls 68 of the stacked package 72 through holes 74 of the lower packages 72. That is, of a portion of the solder of solder balls 68 of the lower package 72 fuses to the superimposed solder balls 68 of the upper packages 72. Each solder ball 68 of the top package 72 also is fused to upper first surface 30a of trace 31 around third hole 74.

In the stack of FIG. 5, the inactive surface 60b of die 60 of each of the packages 72 is oriented downwards towards motherboard 78. In other words, inactive surface 60b of the upper package 72 faces the active surface 60a of die 60 of the lower package 72, and the first surfaces 10b of sheets 10 of the printed circuit boards 55 of the two packages are oriented toward motherboard 78.

In alternative embodiment, additional packages 72 may be stacked on the upper package 72 of the stack of FIG. 5.

Figure 6:
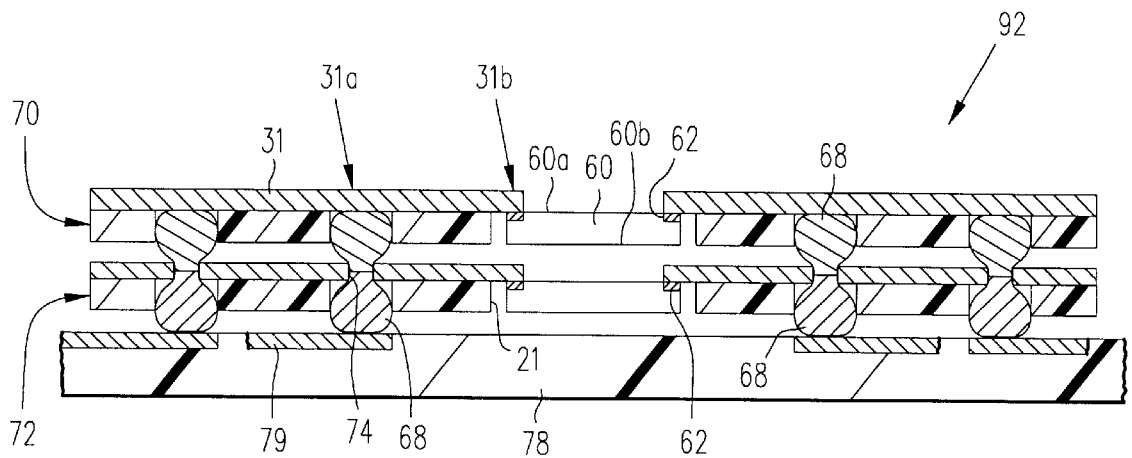

In a further alternative embodiment shown in FIG. 6, a mounting 92 is provided that has a stack of packages mounted on a motherboard 78. This stack includes a lower package 72 and an upper package 70 (see FIG. 1h) that is stacked on the lower package 72. Similar to FIG. 5, each solder ball 68 of the top package 70 is fused to an exposed portion of a corresponding, underlying solder ball 68 of the lower package 72 through a hole 74 in a first portion 31a of a trace 31 of circuit board 55 of lower package 72.

Figure 7:
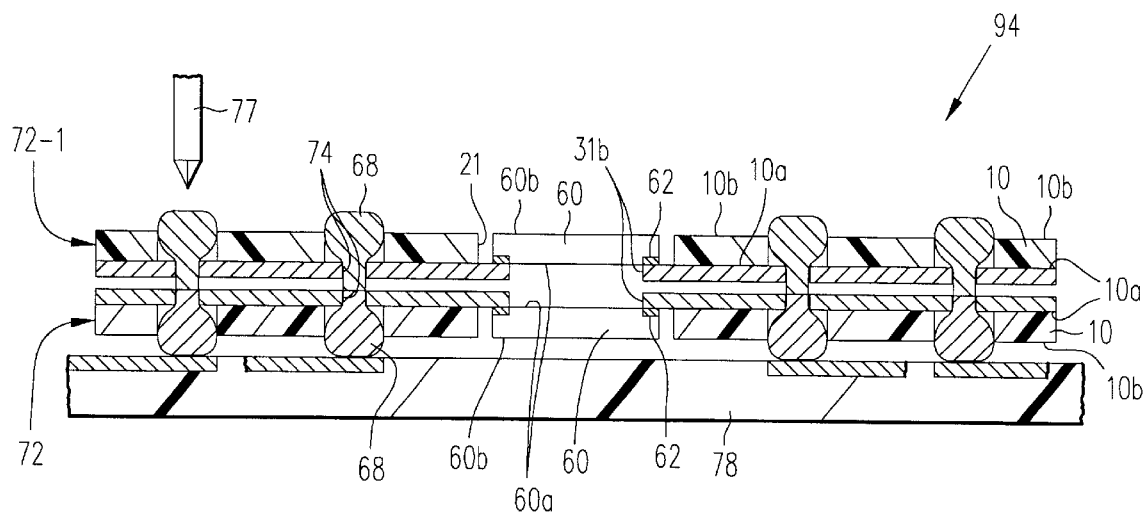

FIG. 7 shows an alternative mounting 94 that includes a stack of two packages 72 and 72-1. The upper package 72-1 is physically is similar to the lower package 72 (hence the similar reference numbers 72 and 72-1). However, the electrical structure of upper package 72-1, and perhaps even the type of die 60, is different from that of the lower package 72 so that the packages 72, 72-1 may be inversely stacked. In particular, packages 72, 72-1 are stacked so that active surface 60a of die 60 of upper package 72-1 faces the active surface 60a of die 60 of the lower package 72.

In FIG. 7, the first surfaces 10a of sheet 10 of the two printed circuit boards 55 are juxtaposed so that appropriate solder balls 68 and holes 74 of the two packages 72, 72-1 overlap. To effect an electrical connection of the stacked packages 72, 72-1, the solder balls 68 of upper package 72-1 are heated so that solder flows through the holes 74 of the upper package 72-1 and fuses to the portion of the corresponding solder ball 68 of the lower package 72 that is exposed through the respective hole 74 of the lower circuit board 55. The solder balls 68 of the top package 72-1 also fuse to the portion 31a of the circuit trace 31 around each hole 74.

The inverse facing arrangement of packages 72 and 72-1 of stack 104 of FIG. 7 may be used where die 60 of lower package 72 and die 60 of upper package 72-1 are optical devices. In such an embodiment, optical circuits at the facing active surfaces 60a of the dies 60 of packages 72, 72-1 may be in optical communication with each other. For example, a light emitting circuit of die 60 of upper package 72-1 may be in optical communication with a light receiving circuit of die 60 of lower package 72, and vice versa.

Figure 8:
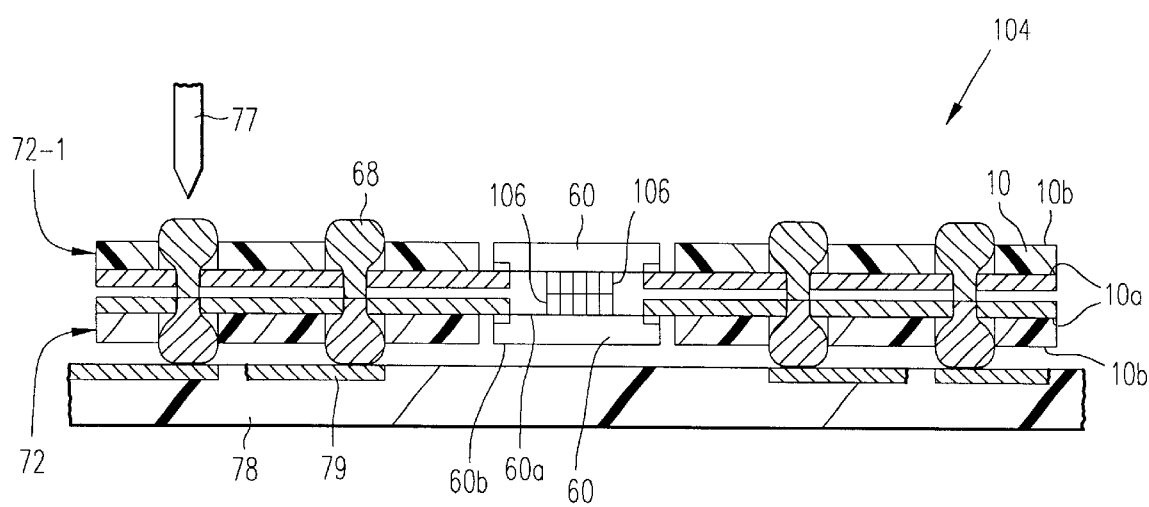

A further alternative stack 104 of two optical packages 72, 72-1 is provided in FIG. 8. Here, a lens 106 is placed on and attached to the active surface 60 of each of the dies 60 of packages 72, 72-1. The two lenses 106 are juxtaposed. Each lens 106 includes a plurality of through holes 108 that serve as channels for the light communicated between the optical circuits of the facing dies 60. For example, a light emitting laser diode of die 60 of top package 72-1 may provide light through the superimposed holes 108 of the juxtaposed lenses 106 to a light receiving photodiode of die 60 of lower package 72, and vice versa. Alternatively, instead of having lenses 106 on or over the active surface of the dies 60, one or both of the packages 72, 72-1 may have optically clear planar, convex, or concave lids 66 spanning aperture 21, as in FIG. 3C, or an optically clear flat-topped encapsulant 64 (see FIG. 3a) over the respective die 60.

Mountings 90, 94, and 104 in FIGS. 5, 7, and 8, respectively, may be electrically tested using an electrical probe 77 positioned above circuit board 55 of the upper package of the stack, as described above. Probe 77 electrically tests the solder connection between the two packages and between the stack of packages and the motherboard 78.

Figure 9:
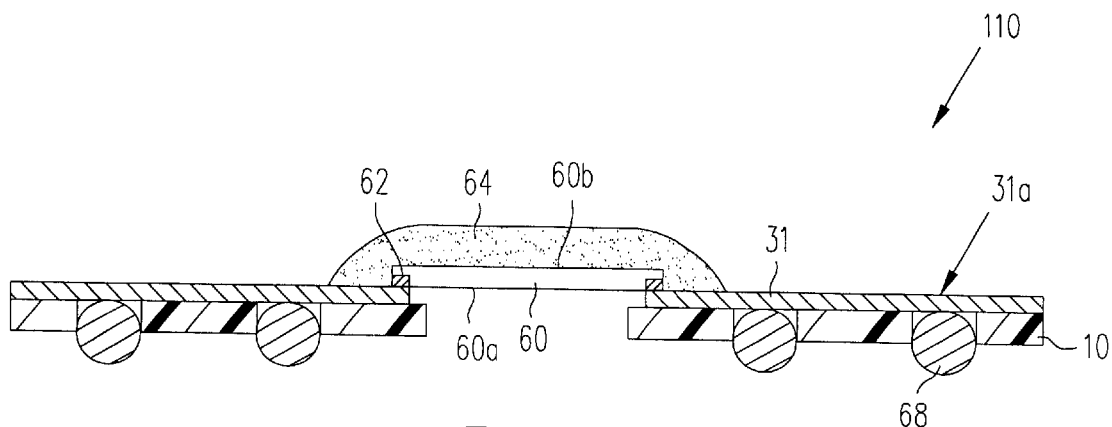
FIG. 9 is a cross-sectional side view of an alternative semiconductor package.

FIG. 9 shows an alternative semiconductor package 110 in accordance with the present invention. Package 110 is the same as package 72, and is made the same way, except that ends 31b of traces 31 do not overhang hole 21, but rather terminate outside of the perimeter of hole 21, and die 60 is mounted in a flip chip style on upper first surface 30a of ends 31b of circuit traces 31. In other words, die 60 is not in hole 21, but rather is superimposed over hole 21. Accordingly, active surface 60a of die 60 is oriented in the direction of lower second surface 10b of sheet 10. Active surface 60a may have optical circuits thereon that send or receive light through hole 21. Encapsulant 64 may be applied over die 60 and onto upper first surface 10a of sheet 10 around hole 21. Encapsulant 64 does not, in this embodiment, cover the portion of first surface 10a of sheet 10 opposite solder balls 68. In a further alternative embodiment, encapsulant may also fill hole 21. Holes 74 may be provided, as in FIG. 4a.

In a mounting, package 110 of FIG. 9 may be stacked on a package 72 of FIG. 4a in a manner similar to that described above for mounting 92 of FIG. 6. In such a mounting, if dies 60 of the respective packages 110, 72 are optical devices, then the optical circuits of the facing active surfaces 60a of the dies 60 of packages 110, 72 may be in optical communication with each other. Lens 106 of FIG. 8 could be attached to each of the dies 60 of the stacked packages 110, 72.

Figure 10A:
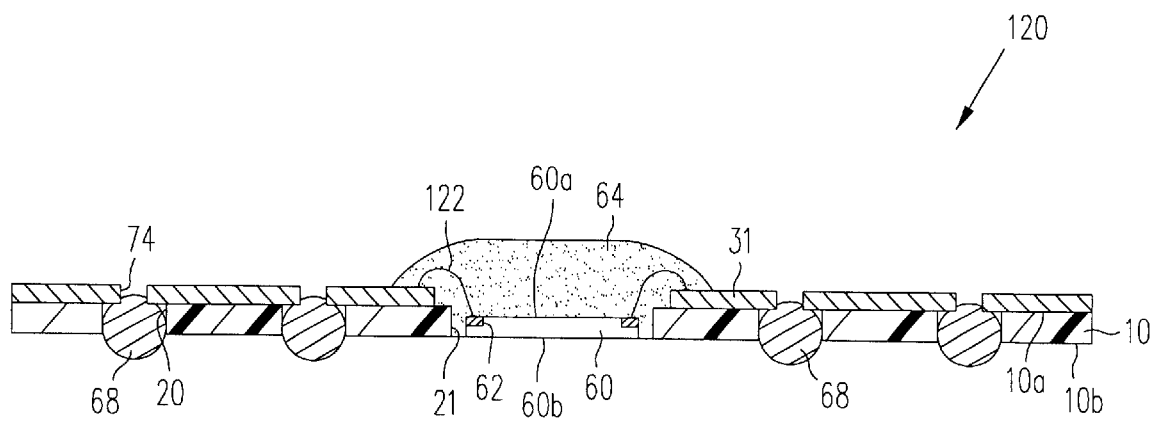
FIG. 10a is a cross-sectional side view of an alternative semiconductor package.

A further alternative package 120 in accordance with the present invention is shown in FIG. 10a. Package 120 is the same as package 70 of FIG. 1g (or may be like package 72 of FIG. 4a), except that circuit traces 31 do not have ends 31b extending over hole 21. Rather, in package 120, ends 31b of traces 31 terminate on upper first surface 10a of sheet 10 outside the perimeter of hole 21. Die 60 is in hole 21. Active surface 60a of die 60 is oriented in the same direction as first surface 10a. Bond wires 122 are electrically connected between bond pads 62 of die 60 and ends 31b of circuit traces 31. Inactive surface 60b of die 60 is in the horizontal plane of lower second surface 10b of sheet 10. Encapsulant 64 supports die 60 in hole 21.

Figure 10B:
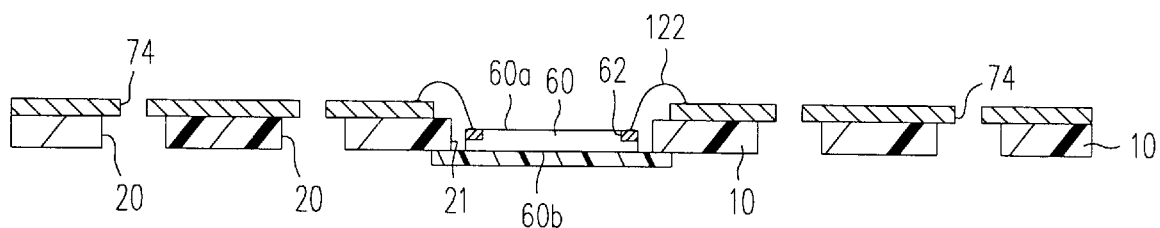
FIG. 10b is a cross-sectional side view of a stage in making the package of FIG. 10a, wherein the die is mounted on a disposable tape.

Package 120 of FIG. 10a is made by the same method as package 72 of FIG. 1, with a few exceptions. First, when metal foil 30 is being patterned, the periphery of hole 21 is not masked, so that ends 31b of metal traces 31 do not extend over hole 21. Further, as shown in FIG. 10b, after circuit traces 31 are formed, an adhesive temporary tape 124 (which may be UV tape) is applied onto lower second surface lob of sheet 10 around and over hole 21. Die 60 is inserted in hole 21, placed on tape 124, and then wire bonded. Finally, encapsulant 64 is applied in hole 21 on tape 124, and over die 60 and bond wires 122. Tape 124 may be removed after encapsulant 64 is cured, exposing inactive surface 60b of die 60.

Package 120 of FIG. 10a may be stacked and tested in the same manner described above for package 72. Package 110 of FIG. 9 also may be stacked in that manner if holes 74 are provided.

The embodiments described above illustrate, but do not limit, our invention. It should also be understood that numerous modifications and variations are possible in accordance with the principles of the present invention. Accordingly, the scope of the invention is defined only by the following claims.

We claim:

1. A printed circuit board for making a semiconductor package comprising:

an insulative glass fiber filled organic laminate substrate having a first surface, an opposite second surface, and a plurality of first apertures and a second aperture through said substrate, wherein said first apertures are each adapted to receive a solder ball and the second aperture is adapted to receive a semiconductor die; and metal circuit traces on said first surface of said substrate, wherein a first portion of each conductive circuit trace overlies a first aperture, and an end of the circuit trace is proximate to the second aperture, the second surface of the substrate being devoid of circuit traces.

2. The printed circuit board of claim 1, wherein a third aperture extends through the first portion of each circuit trace, each third aperture overlying a first aperture.

3. A printed circuit board for making a plurality of semiconductor packages comprising:

a plurality of package sites on an insulative glass fiber filled organic laminate substrate, said substrate having a first surface and an opposite second surface, wherein each package site includes a set of first apertures and a second aperture through the substrate, each of said first apertures being adapted to receive a solder ball and the second aperture being adapted to receive a semiconductor die, and wherein each package site includes a set of metal circuit traces on the first surface of the substrate, the circuit traces each having a first portion overlying a first aperture of the package site and an end proximate to the second aperture of the package site, and wherein the sets of circuit traces are integrally connected, and the second surface of the substrate is devoid of circuit traces.

4. The printed circuit board of claim 3, wherein a third aperture extends through the first portion of the respective circuit traces of each package site, each third aperture overlying a first aperture.

5. A semiconductor package comprising:

a printed circuit board having an insulative glass fiber filled organic laminate substrate with a plurality of metal circuit traces on a first surface thereof and an opposite second surface devoid of circuit traces, wherein a first portion of each circuit trace overlies a first aperture through the substrate, and an end of each circuit trace is proximate to a second aperture through the substrate;

a plurality of solder balls, wherein each solder ball is in one of the first apertures and is fused to the overlying first portion of the circuit trace; and a semiconductor die in the second aperture and electrically connected to the ends of the circuit traces.

6. The package of claim 5, wherein the semiconductor die has an active surface with bond pads thereon and an opposite inactive surface, and the inactive surface is in a horizontal plane with the second surface of the substrate.

7. The package of claim 5, wherein the semiconductor die is electrically connected to the ends of the circuit traces through bond wires.

8. The package of claim 5, wherein the ends of the circuit traces horizontally overhang the second aperture, and the semiconductor die is mounted on the overhanging ends.

9. The package of claim 5, wherein the semiconductor die has an active surface with bond pads thereon and an opposite inactive surface, and the inactive surface is in a horizontal plane between the first and second surfaces of the substrate.

10. The package of claim 5, wherein the semiconductor die is an optical device.

11. The package of claim 10, wherein at least an optical portion of the semiconductor die is covered by an optically clear structure selected from the group of an optically clear encapsulant, a lens, and a lid.

12. A stack of semiconductor packages, the stack comprising:

at least first and second semiconductor packages, wherein each package includes an insulative substrate having a first surface with a plurality of metal circuit traces thereon and an opposite second surface, a plurality of solder balls each extending through an aperture through the substrate, each said solder ball being fused to an underside of a metal trace overlying the respective aperture, and a semiconductor die electrically connected to the solder balls through the traces, wherein a portion of the solder of each solder ball of at least the first semiconductor package is exposed at the first surface of the substrate through an aperture in the respective metal traces, and wherein the second package is mounted over the first surface of the first package so that the solder balls of the second package are each fused to the exposed solder portion of an underlying solder ball of the first package.

13. The stack of claim 12, wherein the first surface of the substrate of the first package is juxtaposed with the first surface of the substrate of the second package.

14. The stack of claim 13, wherein the dies of the first and second packages are optical devices that are positioned for optical communication with each other.

15. The stack of claim 12, wherein the semiconductor die of each package has an active surface with bond pads thereon and an opposite inactive surface, the semiconductor die is within a second aperture through the substrate, and the inactive surface is in a horizontal plane between the first and second surfaces of the substrate.

16. The stack of claim 12, wherein the semiconductor die of each package has an active surface with bond pads thereon and an opposite inactive surface, the semiconductor die is within a second aperture through the substrate, and the inactive surface is in a horizontal plane with the second surface of the substrate.

17. The stack of claim 12, wherein the dies of the first and second packages are optical devices that are positioned for optical communication with each other.

18. The stack of claim 17, wherein the substrates of the first and second semiconductor packages include a second surface opposite the first surface, and the first surface of the substrate of first package is juxtaposed with a second surface of the substrate of second package.

19. The stack of claim 17, further comprising an optically clear structure between the dies of the first and second semiconductor packages.

20. A stack of optical semiconductor packages, the stack comprising:

at least first and second optical semiconductor packages, wherein each package includes an insulative substrate having a first surface with a plurality of metal circuit traces thereon, a plurality of solder balls, and a optical semiconductor die electrically connected to the solder balls through the traces, and wherein the second package is mounted over the first surface of the first package so that solder of each solder balls of the second package is fused to a portion of the solder of an underlying solder ball of the first package and the dies are positioned for optical communication with one another.

21. The stack of claim 20, further comprising an optically clear structure between the dies of the first and second semiconductor packages.

22. The stack of claim 20, wherein the semiconductor die has an active surface with bond pads thereon and an opposite inactive surface, the semiconductor die is within an aperture through the substrate, and the inactive surface is in a horizontal plane with a second surface of the substrate that is opposite the first surface of the substrate.

23. The stack of claim 20, wherein the semiconductor die has an active surface with bond pads thereon and an opposite inactive surface, the semiconductor die is within an aperture through the substrate, and the inactive surface is in a horizontal plane between the first surface of the substrate and an opposite second surface.

24. The stack of claim 20, wherein the first surface of the substrate of the first package is juxtaposed with the first surface of the substrate of the second package.

25. The stack of claim 20, wherein the substrate of the second package includes a second surface opposite the first surface, and the first surface of the substrate of the first package is juxtaposed with the second surface of the substrate of the second package.

26. A stack of semiconductor packages comprising:

first and second semiconductor packages each including a semiconductor die having an optical portion, wherein the first and second semiconductor packages are stacked one on the other, are electrically coupled, and the optical portions of the semiconductor dies face each other for optical communication between the facing optical portions.

27. The stack of claim 26, wherein the first and second semiconductor packages comprise solder balls electrically coupled the semiconductor die of the respective package, and at least some of the solder of the solder balls of the first package is fused to the solder of the solder balls of the second package.

* * * * *

UNITED STATES PATENT AND TRADEMARK OFFICE
CERTIFICATE OF CORRECTION

PATENT NO. : 6,448,506 B1
DATED : September 10, 2002
INVENTOR(S) : Thomas P. Glenn et al.

It is certified that error appears in the above-identified patent and that said Letters Patent is hereby corrected as shown below:

Column 6,
Line 1, delete "optional" and insert -- optionally --;
Line 1, delete "1" and insert -- 10 --;
Line 42, delete "-" before "to"; and Column 10,
Line 32, delete "lob" and insert -- 10b --.

Signed and Sealed this

Eighteenth Day of March, 2003

JAMES E. ROGAN
*Director of the United States Patent and Trademark Office*